United States Patent
Kwon et al.

(10) Patent No.: US 9,384,854 B2
(45) Date of Patent: Jul. 5, 2016

(54) COMPLEMENTARY METAL-OXIDE-SEMICONDUCTOR (CMOS) ANALOG SWITCH CIRCUIT

(71) Applicant: MagnaChip Semiconductor, Ltd., Cheongju-si (KR)

(72) Inventors: Brandon Kwon, Cheongju-si (KR); Jung Hoon Sul, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/277,412

(22) Filed: May 14, 2014

(65) Prior Publication Data

US 2015/0008978 A1  Jan. 8, 2015

(30) Foreign Application Priority Data

Jul. 8, 2013 (KR) .................. 10-2013-0079986

(51) Int. Cl.
  *G11C 27/02* (2006.01)
  *H03K 17/041* (2006.01)
  *H03K 17/06* (2006.01)
  *G05F 3/16* (2006.01)

(52) U.S. Cl.
  CPC .......... *G11C 27/02* (2013.01); *H03K 17/04106* (2013.01); *H03K 17/063* (2013.01); *G05F 3/16* (2013.01); *H03K 2217/0018* (2013.01); *H03K 2217/0054* (2013.01)

(58) Field of Classification Search
  CPC ....................................................... G05F 3/16
  USPC ......... 327/403, 404, 419, 424, 427, 429, 434, 327/437
  See application file for complete search history.

(56) References Cited

U.S. PATENT DOCUMENTS

| | | | | |
|---|---|---|---|---|
| 5,689,209 A * | 11/1997 | Williams et al. | ............... | 327/425 |
| 5,909,139 A * | 6/1999 | Williams | ....................... | 327/434 |
| 5,933,046 A * | 8/1999 | Ramet et al. | .................. | 327/534 |
| 6,008,689 A | 12/1999 | Au et al. | | |
| 6,163,199 A * | 12/2000 | Miske et al. | .................. | 327/434 |
| 6,194,952 B1 * | 2/2001 | Shigehara | ...................... | 327/534 |
| 6,380,792 B1 * | 4/2002 | Yamamoto | .................... | 327/390 |
| 6,538,491 B1 * | 3/2003 | Spanoche | ...................... | 327/337 |
| 6,828,846 B2 * | 12/2004 | Tsukazaki et al. | ............ | 327/404 |
| 7,400,171 B1 * | 7/2008 | Montazer | ........................ | 326/83 |
| 7,554,382 B2 * | 6/2009 | Miske et al. | .................. | 327/382 |
| 7,667,525 B2 * | 2/2010 | Grimone, III | ................. | 327/427 |
| 7,692,473 B2 * | 4/2010 | Ono | ............................. | 327/427 |
| 7,728,649 B1 * | 6/2010 | Webb et al. | .................. | 327/534 |
| 7,924,083 B2 * | 4/2011 | Chou et al. | .................... | 327/391 |
| 7,924,085 B2 * | 4/2011 | Guo | ............................. | 327/534 |
| 8,008,963 B2 * | 8/2011 | Sonehara et al. | ............ | 327/427 |
| 8,283,968 B2 * | 10/2012 | Ramet | .......................... | 327/391 |
| 8,289,066 B2 * | 10/2012 | Guo | ............................. | 327/427 |

(Continued)

*Primary Examiner* — Thomas J Hiltunen

(57) ABSTRACT

A Complementary Metal-Oxide-Semiconductor (CMOS) analog switch has a circuit structure such that when a supply voltage is applied, the CMOS analog switch biases voltages at both ends of a Metal-Oxide-Semiconductor Field Effect Transistor (MOS) device, which switches on upon application of supply voltage, to a substrate node of MOS, or biases the substrate voltage of MOS device to a ground voltage state during a switching-off operation. The substrate voltage of MOS device in floating state is still biased to the ground voltage state even when abnormal, high voltages are applied to both ends of the MOS device. As a result, threshold voltage and conduction resistance decrease compared to related analog switches, and frequency bandwidth increases.

20 Claims, 6 Drawing Sheets

(56) References Cited

U.S. PATENT DOCUMENTS

| | | | |
|---|---|---|---|
| 8,344,789 B2* | 1/2013 | Webb | 327/534 |
| 8,368,453 B2* | 2/2013 | Company Bosch et al. | 327/427 |
| 8,629,709 B2* | 1/2014 | Iraha et al. | 327/427 |
| 8,779,839 B2* | 7/2014 | Snowdon | 327/427 |
| 8,947,156 B2* | 2/2015 | Stultz et al. | 327/534 |
| 2003/0016072 A1* | 1/2003 | Ramakrishnan | 327/434 |
| 2003/0023804 A1* | 1/2003 | Matsuda et al. | 710/313 |
| 2013/0300493 A1* | 11/2013 | Chen et al. | 327/434 |
| 2013/0321063 A1* | 12/2013 | Cozzolino | 327/437 |
| 2014/0132311 A1* | 5/2014 | Stultz et al. | 327/109 |
| 2014/0193003 A1* | 7/2014 | Gagne | 381/123 |

* cited by examiner

COMPLEMENTARY METAL-OXIDE-SEMICONDUCTOR (CMOS) ANALOG SWITCH CIRCUIT

CROSS-REFERENCE TO RELATED APPLICATIONS

This application claims the benefit under 35 U.S.C. §119(a) of Korean Patent Application No. 10-2013-0079986 filed on Jul. 8, 2013, in the Korean Intellectual Property Office, the entire disclosure of which is incorporated herein by reference for all purposes.

BACKGROUND

1. Field

The following description relates to circuit design. Also, the following description relates to circuits that are Complementary Metal-Oxide-Semiconductor (CMOS) switch circuit, and also to a CMOS analog switch circuit configured to suppress substrate effects from generating due to a voltage difference between substrate and source terminals and to maintain substrate (body) voltage to ground voltage (vss) state irrespective of whether supply voltage (vdd) is applied or not. For example, the description includes biasing the substrate voltage of a transistor operating as a switching device.

2. Description of Related Art

Analog switches switch on and off an analog signal in accordance with an external control signal. To ensure normal on/off operation, the control signal avoids inappropriate signal information.

To design an analog switch, a Metal-Oxide-Semiconductor Field Effect Transistors (MOSFET, referred to subsequently as "MOS") with small drive power and excellent switching speed is used.

A few examples of an analog switch designed using MOS technology will be explained below.

FIG. 1 is a circuit diagram of a CMOS analog switch designed according to related approaches.

The analog switch illustrated in FIG. 1, in particular, has two MOS. That is, NMOS and PMOS, differing from each other, are connected in parallel to each other.

The gates of the NMOS and PMOS are each connected to a control terminal to apply a control signal. The control terminal provides a high control signal or a low control signal to set the switch as being on or off.

The drains and sources of the NMOS and PMOS act as nodes of the switch on both sides of the switch.

In the analog switch 10 with an architecture as explained above and illustrated in FIG. 1, a signal is conducted or isolated in accordance with a control signal applied to the NMOS and the PMOS. Hence, an application of a high control signal to the NMOS and a low control signal to the PMOS causes formation of appropriate channels using the appropriate carriers in the NMOS and the PMOS. Because the channels form, the application of such control signals permits a signal to pass. By contrast, the application of a low control signal to the NMOS and a high control signal to PMOS causes the NMOS and PMOS to turn into cut-off state at which a signal is blocked.

Since supply voltage level is directly applied to the sources of the NMOS and the PMOS of the particular example of an analog switch as illustrated in FIG. 1, such direct application of a supply voltage level creates a voltage difference between the substrate and the sources. This is called a substrate effect, which has an impact on certain characteristics of the analog switch illustrated in FIG. 1. For example, the substrate effect increases a threshold voltage of MOS and also increases conduction resistance of the switch. Increased threshold voltage in the transistor increases power consumption. Furthermore, increased conduction resistance hinders normal on and off switching operation of the transistor. Furthermore, the substrate effect also interferes with the linear characteristic and the harmonic distortion of an analog switch.

Another related approach to designing an analog switch with a different circuit construction to deal with the above-mentioned problems has been suggested. Such an analog switch will be explained below with reference to FIG. 2.

FIG. 2 is a circuit diagram of another related analog switch with a different design than the switch of FIG. 1.

The analog switch 20 of FIG. 2 uses a total of three MOS, where the MOS in FIG. 2 are all of the same type of MOS. That is, the analog switch 20 of FIG. 2 includes a NMOS 1 for providing switching function. FIG. 2 also includes NMOS 2 and NMOS 3 that are provided to bias the substrate voltage of NMOS 1 to help manage the substrate effect discussed previously.

The gate of NMOS 1 is connected to the control terminal 22, while the source and the drain of NMOS 1 are terminals of NMOS 1 on both sides that are involved with the on and off switching operation of NMOS 1. For example, the drain-side terminal switches off NMOS 1, while the source-side terminal switches on NMOS 1. The gate of NMOS 2 is connected to the control terminal 22, while the source and the substrate of NMOS 2 are connected to a substrate node (a) of NMOS 1. The gate of NMOS 3 is connected to the control terminal 22 via an inverter, the drain of NMOS 3 is connected to the substrate node (a) of NMOS 2, and the source of NMOS 3 is grounded.

The analog switch illustrated in FIG. 2 with the above-explained circuit construction may avoid a substrate effect, because there is no voltage difference generated between the source and substrate of NMOS 1 when it operates as a switch, due to the other components of the analog switch.

Thus, when a high control signal is generated from the control terminal 22, both NMOS 1 and NMOS 2 turn on. Accordingly, a channel for signal transmission is formed. However, NMOS 3 remains in an off state, because a low control signal is applied to it by the inverter, which inverts the control signal from the control terminal 22.

Since the source and the substrate of NMOS 3 are connected to the substrate node (a) of NMOS 1, the voltage level of node (b), to which the drain of the first NMOS and the drain of the second NMOS are connected, is directly transmitted to the substrate node (a).

As a result, the source and the substrate of NMOS 1 do not have a voltage difference. Therefore, no substrate effect occurs.

However, the example of FIG. 2 is limited to functioning only in situations when supply voltage (vdd) is successfully fed.

Accordingly, when the supply voltage (vdd) is not successfully applied, other issues with the operation of the switch occur. That is, in situations where the switch operates without the application of the supply voltage, both the control terminal 22 and the drain-side terminal of NMOS 1 assume a ground voltage (vss) level. As a result, since both the control terminal 22 and the drain-side terminal of NMOS 1 assume a ground voltage (vss) level, it leaves the substrate node (a) in floating state. As a result, when the substrate node (a) is not turned to ground voltage (vss) level because it is in a floating state, NMOS 1 enters into unstable state. In such an unstable state, latch-up and leakage current from the switch may occur.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Various examples provide a CMOS analog switch circuit with an improved circuit construction that does not suffer a substrate effect due to substrate (body) voltage bias in accordance with a voltage level of a signal applied to the analog switch.

Examples also prevent floating of a substrate voltage.

In one general aspect, a Complementary Metal-Oxide-Semiconductor (CMOS) analog switch includes a first Metal-Oxide-Semiconductor Field Effect Transistor (MOS) configured to receive a supply voltage and switch in response to an externally-applied control signal, and a voltage extractor configured to extract a drain-side or a source-side voltage of the first MOS in response to a turning on of the first MOS, and configured to bias the extracted voltage to a substrate node of the first MOS.

The voltage extractor may include a first voltage extractor configured to extract a drain-side voltage of the first MOS, and a second voltage extractor configured to extract a source-side voltage of the first MOS.

The first voltage extractor may include a second MOS and a third MOS with crossing gate nodes and drain nodes that are connected to a gate terminal and a drain terminal of the first MOS, respectively, and with source nodes connected to the substrate node, and the second voltage extractor may include a fourth and a fifth MOS with crossing gate nodes and drain nodes which are connected to the gate node and the source terminal of the first MOS, respectively, and source nodes connected to the substrate node.

The first to fifth MOS may all be of the same type.

A voltage potential of the substrate node may be the same as a voltage potential at the gate of the first MOS or at a source side of the first MOS.

The CMOS analog switch may further include a charge pump configured to increase the supply voltage so that a voltage higher than the supply voltage is applied to the gate terminal of the first MOS.

The CMOS analog switch may further include an inverter connected to a gate node of the first MOS, and a sixth MOS connected so as to be on or off in response to an output signal of the inverter, wherein in response to the supply voltage being supplied and the first MOS being in an off state, the substrate voltage of the substrate node may be biased to the ground voltage via the sixth MOS, which is turned on in response to a high signal of the inverter.

In the sixth MOS, a gate may be connected to an output end of the inverter, a drain may be connected to the substrate node, and a source may be grounded.

The inverter may operate when a drain-side voltage and a source-side voltage of the first MOS both exceed a threshold voltage.

The CMOS analog switch may further include a seventh MOS configured to receive a control signal with an opposite phase to that of the control signal applied to the first MOS, wherein in response to the sixth MOS maintaining an off state, the seventh MOS may turn on in response to a high control signal to bias the substrate voltage of the substrate node with a ground voltage level to the ground voltage.

The sixth and seventh MOS may be of the same type of MOS as the first MOS.

The CMOS analog switch may further include a third voltage extractor comprising two MOS in which gate nodes and drain nodes are crossed each other and connected to the drain node and the source node of the first MOS, wherein the two MOS may be of a different type from the first MOS, and abnormal voltage applied to the drain side or source side of the first MOS may be extracted.

In response to the supply voltage not being supplied, the third voltage extractor may extract an applied abnormal voltage received at the drain side or source side of the first MOS, and the substrate voltage of the substrate node may be biased to ground voltage via the third voltage extractor and the sixth MOS which turns on in accordance with an output signal from the inverter.

In another general aspect, a Complementary Metal-Oxide-Semiconductor (CMOS) analog switch includes a first Metal-Oxide-Semiconductor Field Effect Transistor (MOS) configured to receive a supply voltage and switch in response to an externally-applied control signal, a first voltage extractor configured to extract a drain-side voltage of the first MOS, and a second voltage extractor configured to extract a source-side voltage of the first MOS, wherein the first voltage extractor or the second voltage extractor biases the extracted voltage to a substrate node of the first MOS.

The first voltage extractor may include a second MOS and a third MOS with crossing gate nodes and drain nodes that are connected to a gate terminal and a drain terminal of the first MOS, respectively, and with source nodes connected to the substrate node.

The second voltage extractor may include a fourth and a fifth MOS with crossing gate nodes and drain nodes which are connected to the gate node and the source terminal of the first MOS, respectively, and source nodes connected to the substrate node.

A voltage potential of the substrate node may be the same as a voltage potential at the gate of the first MOS or at a source side of the first MOS.

The CMOS analog switch may further include a charge pump configured to increase the supply voltage so that a voltage higher than the supply voltage is applied to the gate terminal of the first MOS.

The CMOS analog switch may further include an inverter connected to a gate node of the first MOS, and a sixth MOS connected so as to be on or off in response to an output signal of the inverter, wherein in response to the supply voltage being supplied and the first MOS being in an off state, the substrate voltage of the substrate node may be biased to the ground voltage via the sixth MOS, which is turned on in response to a high signal of the inverter.

The CMOS analog switch may further include a third voltage extractor comprising two MOS in which gate nodes and drain nodes are crossed each other and connected to the drain node and the source node of the first MOS, wherein the two MOS are different type from the first MOS, and abnormal voltage applied to the drain side or source side of the first MOS is extracted.

The CMOS analog switch circuit with the above architecture provides certain effects.

Since the voltages at both ends of a MOS in a switch-on state are biased to the substrate node of the MOS using a minimum voltage extractor when a supply voltage is applied, the source voltage and the substrate voltage of the MOS are same. As a result, a substrate effect is eliminated.

Further, in examples, the substrate voltage of the MOS in a switch-off state is biased to ground voltage (vss) state when a supply voltage is applied and the substrate voltage of the MOS in a floating state can also be biased to ground voltage (vss) state through the maximum voltage extractor, even when abnormal, high voltages are applied to both ends of the MOS.

According to various examples, the CMOS analog switch has a circuit structure that addresses the issues associated with related switching structures. For example, the substrate effect is eliminated, and the floating of substrate voltage is also eliminated.

Accordingly, compared to alternative CMOS analog switch designs, in examples, threshold voltage and conduction resistance decrease, and frequency bandwidth increases.

Furthermore, when implemented in sample and hold circuit environment, the CMOS analog switch also improves harmonic distortion. For example, a sample and hold circuit environment includes an analog design that samples the voltage of a continuously varying analog signal and holds its value at a constant level for a specified minimum period of time.

Other features and aspects will be apparent from the following detailed description, the drawings, and the claims.

BRIEF DESCRIPTION OF THE DRAWINGS

FIG. 4 shows changes of NMOS threshold voltage according to input voltage. FIG. 5 shows changes of conduction resistance. FIG. 6 shows change of substrate voltage according to input voltage when supply voltage (vdd) is not applied.

Figure 1:
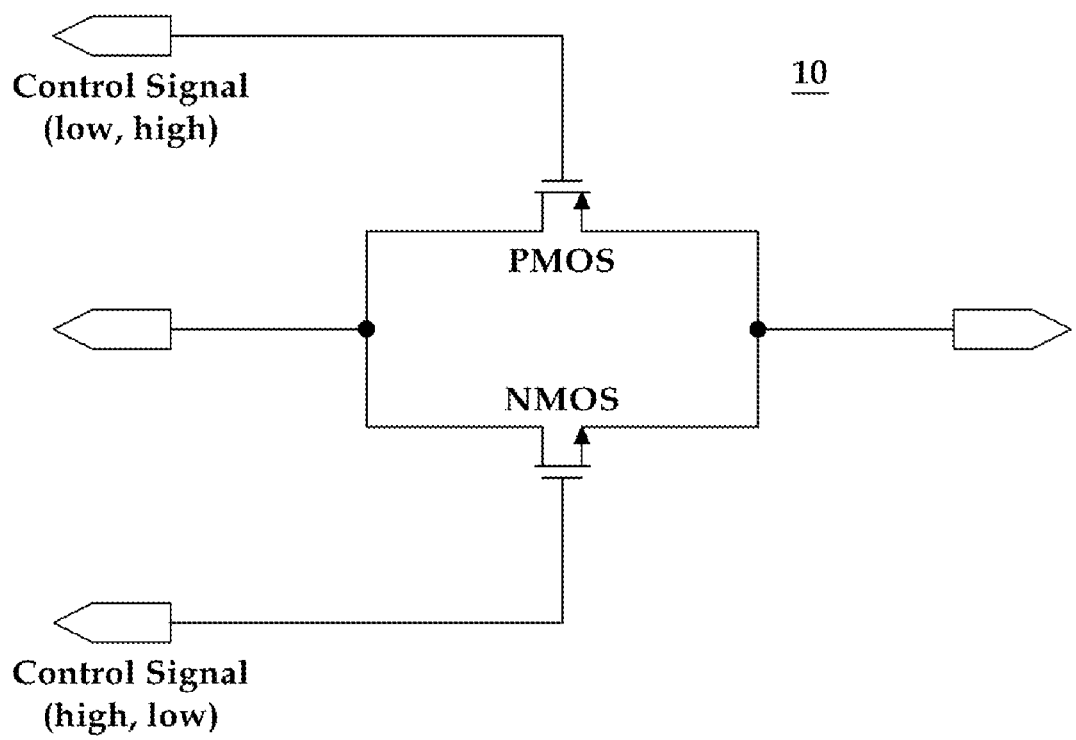
FIG. 1 is a circuit diagram of a related CMOS analog switch.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 3:
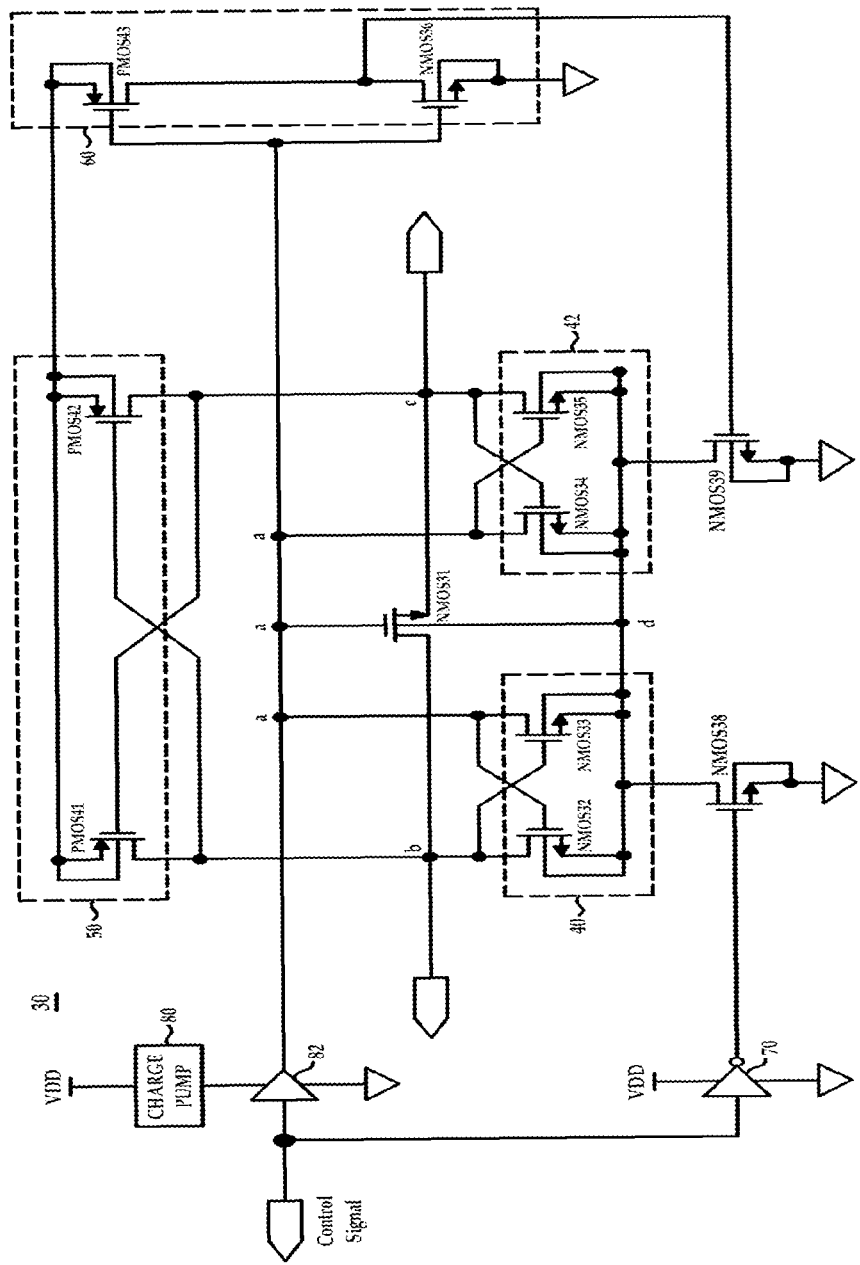
FIG. 3 is a circuit diagram of a CMOS analog switch according to an example.

FIG. 3 is a circuit diagram of a CMOS analog switch according to an example.

Referring to FIG. 3, the CMOS analog switch 30 includes NMOS 31 for a switching function. In NMOS 31, the gate of NMOS 31 receives a control signal to turn on and off operation of NMOS 31. The drain-side and source-side terminal voltages of NMOS 31 act to bias the substrate voltage of NMOS 31 via minimum voltage extractors 40, 42 which are explained further below.

A first minimum voltage extractor 40 and a second minimum voltage extractor 42 are provided to bias the substrate voltage of NMOS 31 to ground power (vss) level. The minimum voltage extractors 40, 42 accomplish the biasing by using the voltage applied to both ends of NMOS 31, that is, using the drain-side and the source-side terminal voltages.

The first minimum voltage extractor 40 and the second minimum voltage extractor 42 each include two NMOS. That is, the first minimum voltage extractor 40 includes NMOS 32 and NMOS 33, and the second minimum voltage extractor 42 includes NMOS 34 and NMOS 35. The drain of NMOS 32 and the gate of NMOS 33 of the first minimum voltage extractor 40 are connected to the drain-side node (b) of NMOS 31, and the gate of NMOS 32 and the drain of NMOS 33 are connected to the gate-side node (a) of NMOS 31. The drain of NMOS 34 and the gate of NMOS 35 of the second minimum voltage extractor 42 are connected to the gate-side node (a) of NMOS 31, and the gate of NMOS 34 and the drain of NMOS 35 are connected to the source-side node (c) of NMOS 31. Additionally, the sources of NMOS 32, NMOS 33, NMOS 34 and NMOS 35 are all respectively connected to the substrate node (d) of NMOS 31. Since the substrate node (d) is the node at which the respective sources of NMOS 32, NMOS 33, NMOS 34 and NMOS 35 are commonly connected, the substrate node (d) is also referred to herein as a common source node.

A maximum voltage extractor 50 is connected to the node (b) and node (c) of NMOS 31. The maximum voltage extractor 50 acts to bias the substrate voltage of NMOS 31 to a ground voltage (vss) level, when a high voltage exceeding supply voltage (vdd) is applied to both ends of NMOS 31. The maximum voltage extractor 50 includes PMOS 41 and PMOS 42, such that PMOS 41 and PMOS 42 have crossing gates and drains. The drain of PMOS 41 is connected to the node (b), and the drain of PMOS 42 is connected to the node (c).

The output node of the maximum voltage extractor 50 is provided with a first inverter 60. The first inverter 60 includes PMOS 43 and NMOS 36. The gates of PMOS 43 and NMOS 36 are both connected to the gate terminal (a) of NMOS 31.

The output side of the first inverter 60 is connected with NMOS 39 at its gate. NMOS 39 operates when the substrate voltage is biased into the ground voltage (vss) level. Accordingly, the drain of NMOS 39 is connected to the substrate node (d) and the source is connected to the ground voltage (vss).

The first inverter 60 operates when the voltage of both ends of NMOS 31, are sufficient. That is, the first inverter 60 operates when the voltage potentials at the node (b) and node (c) are both greater than a preset threshold voltage. Accordingly, depending on the situation and when the voltages at both ends of NMOS 31 are lower than the threshold voltage, the first inverter 60 does not operate. Because the first inverter 60 does not operate, it causes the substrate voltage of NMOS 31 to be biased to a ground voltage (vss) level.

To that purpose, NMOS 38 is provided in which the gate is connected to the gate node (a) and the drain is connected to the substrate node (d), and the source is connected to the ground voltage (vss). NMOS 38 is provided with a second inverter 70 at the gate side to receive a control signal that has an opposite phase to that of the control signal.

Meanwhile, NMOS 31 is designed so that the voltage applied to the gate of NMOS 31 is higher than the supply voltage (vdd). The applied voltage to the gate is higher. As a result of the applied voltage being higher, it helps to address practical issues such as causing a decrease in the conduction resistance of NMOS 31, and so on. To that purpose, in the example of FIG. 3 a charge pump 80 and a buffer 82 are provided between the supply voltage (vdd) and the gate terminal (a) of NMOS 31. Accordingly, the supply voltage (vdd) is converted by the charge pump 80 into high enough voltage as required in its design, before being applied to the gate side of NMOS 31. A charge pump acts as a DC-DC converter and uses capacitors as energy source elements to create a high or lower voltage power source. In this context, the charge pump 80 increases the voltage of the power source. Charge pumps are capable of high efficiencies and are also electrically simple circuits.

The operation of the CMOS analog switch 30 is explained further below.

In one example, the CMOS analog switch 30 resolves the issues that occur in the related approaches, such as substrate effect and floating of substrate voltage. To resolve these issues, the CMOS analog switch 30 prevents a voltage difference between the source and the substrate nodes of NMOS 31. The CMOS analog switch 30 also stably maintains the substrate voltage of the substrate node (d) at the ground voltage (vss) level.

In examples, the above features are achieved in three main ways. That is, the substrate effect occurs under a condition that the supply voltage (vdd) is supplied and that NMOS 31 is turned on, while the floating of the substrate voltage occurs under a condition that NMOS 31 is turned off and depends upon the presence or absence of the supply voltage (vdd). Hence, approaches are discussed below explaining how to suppress the substrate effect in consideration of the above conditions, and also explaining the biasing of the substrate voltage into ground voltage (vss).

First, the supply voltage (vdd) is supplied to the analog switch 30. Also, NMOS 31 is turned on.

With the application of a high control signal, the supply voltage (vdd) is converted into higher voltage by the charge pump 80 and the buffer 82 as discussed previously. After the voltage conversion, the supply voltage (vdd) is applied on the gate node (a).

According to the control signal, the gate node (a) assumes a high state. Accordingly, NMOS 31 turns on when the gate node (a) assumes the high state. When the NMOS 31 turns on, the voltage potential at the node (b) and the voltage potential at the node (c) on the drain and source sides match each other.

In such a situation, the first minimum voltage extractor 40 receives the voltages of the gate node (a) and node (b) via the gate terminals of NMOS 32 and NMOS 33. Accordingly, the voltage of the node (b) is generated at the substrate node (d). Furthermore, the second minimum voltage extractor 42 receives the voltages of the gate node (a) and node (c) via the gate terminals of NMOS 34 and NMOS 35. As a result, the voltage of node (c) is generated at the substrate node (d).

Accordingly, because the voltage of node (b) or the voltage of node (c) is applied to the substrate node (d) of NMOS 31, the substrate voltage of the substrate node (d) is substantially identical to the voltage of node (b) or the voltage of node (c). Therefore, the source and the substrate of NMOS 31 have the same potential level of voltage. Hence, the source and the substrate of NMOS 31 do not have a voltage difference, potentially avoiding certain issues discussed above that occur when a voltage difference is present.

As explained above, in various examples, the substrate effect associated with related analog switches is reduced or prevented. Therefore, increasing threshold voltage and conduction resistance for the switch is reduced.

Meanwhile, when the supply voltage (vdd) is supplied and NMOS 31 turns on, NMOS 39 and NMOS 38 that are connected to the substrate node (d) do not influence the circuit operation. As explained above, because node (b) and node (c) have the same voltage potential as the substrate node (d), the output node of the maximum voltage extractor 50 maintains a high impedance state. However, because the node (a) in a high state is connected to the gate terminals of PMOS 43 and NMOS 36 included in the first inverter 60, the output side of the first inverter 60 is in a low state, which is the ground voltage (vss) level. Further, because the input of the second inverter 70 is connected to the node (a) in a high state, the output side of the second inverter 70 is in a low state, that is the ground voltage (vss) level. Accordingly, both NMOS 39 and NMOS 38 are connected to the output sides of the first and second inverters 60, 70 and are in the cut-off region.

Second, the supply voltage (vdd) is supplied to the analog switch in a situation in which the NMOS 31 is in an off state. In this situation, an example may bias the substrate voltage of the substrate node (d) to ground voltage (vss).

Additionally, in this situation, because NMOS 31 is in off state, the control signal is in low state. As a result, the voltage at the gate node (a) is also in the ground voltage (vss) state.

Accordingly, since the voltage of node (b) and the ground voltage (vss) are applied at the first minimum voltage extractor 40, the voltage of the substrate node (d) is also applied as the ground voltage (vss). Likewise, since the voltage of the node (c) and the ground voltage (vss) are applied at the second minimum voltage extractor 42, the voltage of the substrate node (d) is also applied as the ground voltage (vss).

When the voltage of the substrate node (d) is in the ground voltage (vss) level, an example provides stable biasing to the ground voltage (vss). This stable biasing is accomplished by turning on NMOS 39 connected to the substrate node (d). That is, because the gate node (a) is in the ground voltage (vss) state, the output side of the first inverter 60 connected to the gate node (a) outputs a high output value. As a result, NMOS 39 that is connected to the output side of the first inverter 60 turns on in accordance with the high gate input. Also, the substrate voltage of the substrate node (d) is biased to the ground voltage (vss) by NMOS 39. As a result, the issue of floating substrate voltage when the supply voltage (vdd) is not applied is resolved.

Additionally, to bias the substrate voltage to the ground voltage (vss), an example is designed so that the output value of the first inverter 60 is outputted in a high state. The first inverter 60 is designed to output an output value in a high state, because if the first inverter 60 fails to operate and NMOS 39 remains in an off state, the substrate voltage is not biased to the ground voltage (vss). When the substrate voltage is not biased to the ground voltage (vss), issues arise as discussed above. The condition for the first inverter 60 to operate is that the voltages of the node (b) and node (c) of NMOS 31 are above a threshold voltage, where the threshold voltage is set at a level that is sufficient to operate the first inverter 60.

However, there are some situations that occur in which the voltages of the node (b) and node (c) of NMOS 31 are lower than the threshold voltage.

In such situations, the substrate voltage can be biased to the ground voltage (vss) using NMOS 38, which is connected to the first minimum voltage extractor 40. Hence, when the first inverter 60 is in a region that it is non-operable, as discussed, the output of the second inverter 70 connected to the gate node (a) outputs a high output value. Accordingly, NMOS 38 turns on, and the substrate voltage of the substrate node (d) is biased to the ground voltage (vss) with NMOS 38 in this situation.

Accordingly, an example fixes the substrate voltage to the ground voltage (vss), even when the supply voltage (vdd) is supplied and NMOS 31 is in off state, by providing an alternative way to ensure that the substrate voltage and ground voltage are coordinated.

In a third situation, the supply voltage (vdd) is not supplied, and hence unstable, abnormal voltage is applied to the node (b) and node (c) of NMOS 31. As in the second situation, it is necessary to fix the substrate voltage to the ground voltage (vss) to ensure proper operation.

Because the supply voltage (vdd) is not applied in this situation, the gate node (a) connected to the supply voltage (vdd) is in the ground voltage (vss) level state. The output of the second inverter 70 is also in the ground voltage (vss) level state. Accordingly, NMOS 38 is in the cut-off region in this situation.

In such a situation, an abnormal voltage is introduced to the node (b) or node (c). As a result, the maximum voltage extractor 50 connected to the node (b) and node (c) extracts such an abnormal voltage.

After extracting the voltages of node (b) and node (c), the maximum voltage extractor 50 then outputs the voltage that is higher between the voltages of node (b) and node (c). The outputted voltage from the maximum voltage extractor 50 is inputted to the first inverter 60.

The supply voltage of the first inverter 60 is the abnormal voltage generated at the node (b) or node (c) and is identical to the voltage outputted from the maximum voltage extractor 50. Hence, the first inverter 60 outputs the output voltage from the maximum voltage extractor 50 as is. Accordingly, NMOS 39 receives a high input, and turns on.

According to the turning on of NMOS 39 just discussed, the substrate voltage of the substrate node (d) is biased to the ground voltage (vss) by NMOS 39.

As explained above in the third situation, by the design of the examples, the substrate voltage is biased to the ground voltage (vss) state, even when abnormal voltages are applied to both ends of NMOS 31.

Furthermore, by stably biasing the substrate voltage to the ground voltage (vss) as discussed, the issues associated with the related approaches, such as threshold voltage and conduction resistance are effectively managed.

The efficacy of the above examples is illustrated through experimental results comparing the operation of examples with the operation of related analog switch circuits. The changes in the threshold voltage, conduction resistance and substrate node voltage were compared with each other, as explained below with reference to FIGS. 4 to 6.

Figure 4:
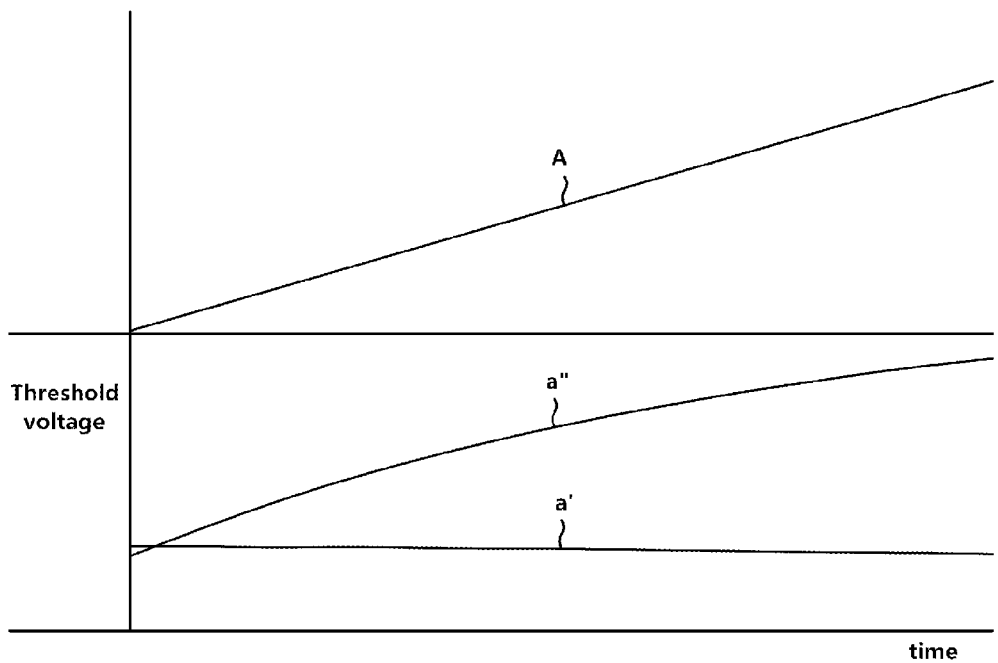
FIGS. 4, 5, and 6 are graphical representations of comparisons between related switch circuits and switch circuit according to an example.

FIG. 4 is a graphical representation of changes in the NMOS threshold voltage according to input voltage.

Figure 2:
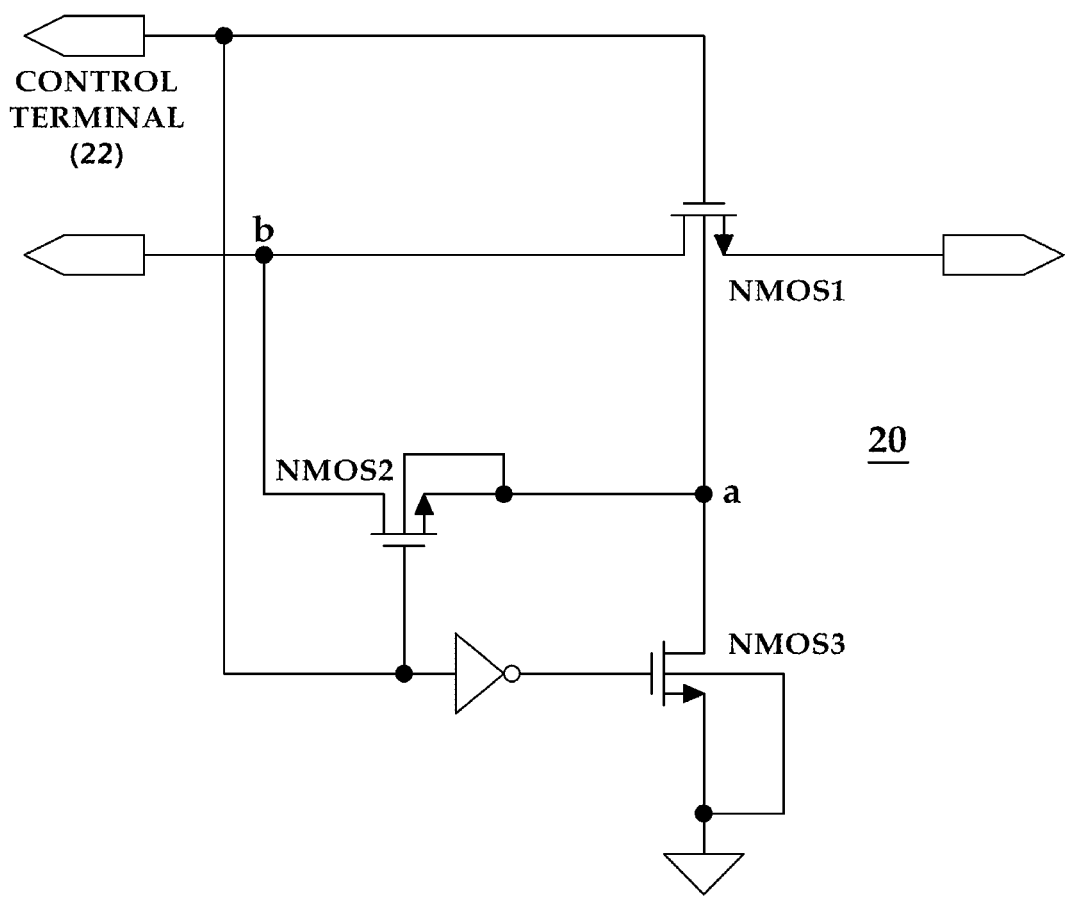
FIG. 2 is circuit diagram of another related analog switch.

Referring to FIG. 4, A represents input voltage supplied to the switch, a" represents changes in NMOS threshold voltage of the related analog switch of FIG. 2, and a' represents changes in NMOS threshold voltage of an analog switch according to an example.

As illustrated, the threshold voltage, according to the example, is kept constant at a'. On the contrary, the related approach shows a non-linear increase of threshold voltage.

Figure 5:
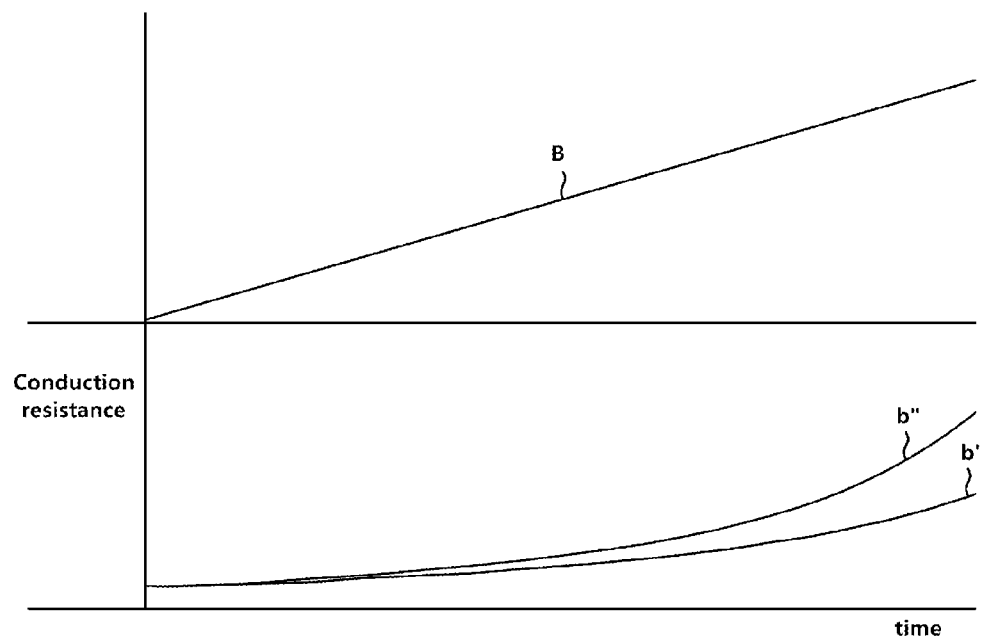

FIG. 5 is a graphical representation of changes in the conduction resistance. Referring to FIG. 5, B represents input voltage supplied to the switch, b" represents changes in conduction resistance of the related analog switch of FIG. 2, and b' represents changes in conduction resistance of analog switch according to an example.

As illustrated, the analog switch according to an example has significantly decreased conduction resistance (b') with respect to that (b") of the related switch.

Figure 6:
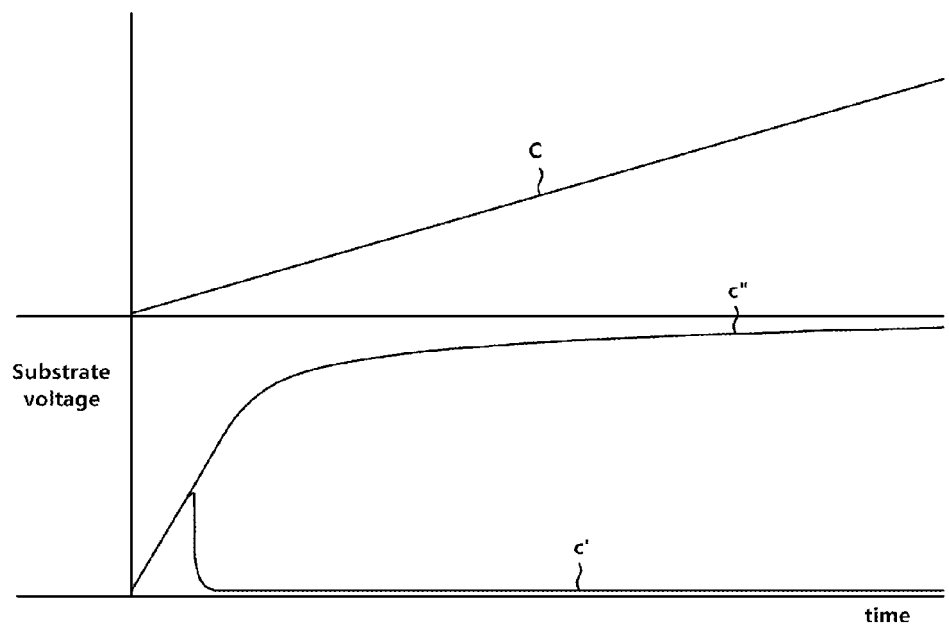

FIG. 6 is a graphical representation of changes in the substrate voltage in accordance with input voltage, when supply voltage (vdd) is not applied.

Referring to FIG. 6, C represents input voltage supplied to the switch, c" represents the substrate voltage of the related analog switch of FIG. 2, and c' represents changes in substrate voltage of analog switch according to an example.

As illustrated, the related analog switch has an unstable, floating substrate voltage characteristic (c"), while the analog switch according to the example has a substrate voltage characteristic that is stably biased to the ground power (vss) level state.

Accordingly, based on comparisons of the threshold voltages, the conduction resistances and the substrate voltages between the analog switch according to various examples and related art switches, as shown in FIGS. 4-6, the comparisons show that the threshold and conduction resistance are decreased, and the substrate voltage is stably biased to the ground voltage (vss), according to the examples.

Meanwhile, the CMOS analog switch illustrated and explained above uses NMOS transistors and PMOS transistors, according to a certain example. However, the examples are not limited to the above specific example only. Accordingly, it is also possible to construct a CMOS analog switch using PMOS transistors in place of NMOS transistors and vice versa, to eliminate substrate effect and prevent floating of the substrate voltage, according to various examples.

As explained above, in various examples, a voltage drop is prevented between the source of MOS switch operating as a switch and the substrate node, and the substrate voltage applied on the substrate node of the MOS switch is stably biased to the ground voltage (vss). As a result, the issues that are associated with the related art analog switch, such as increasing threshold voltage and conduction resistance, and floating substrate voltage, are resolved.

Additionally, while the examples presented herein maintain equal distances between the sides of the halo region and the sides of the source/drain LDD region that form the halo region, other examples are not so limited. For example, in another example, a distance between the halo region and the source LDD region may be shorter or longer than a distance between the halo region and the drain LDD region.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blu-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A Complementary Metal-Oxide-Semiconductor (CMOS) analog switch, comprising:
   a first Metal-Oxide-Semiconductor Field Effect Transistor (MOS) configured to receive a supply voltage and switch in response to an externally-applied control signal; and
   at least two voltage extractors configured to extract a drain-side and a source-side voltage of the first MOS in response to a turning on of the first MOS, and configured to bias the extracted voltage to a substrate node of the first MOS,
   wherein each of the voltage extractors comprises at least two MOS that are of the same type, and each of the voltage extractors is connected to a gate terminal of the first MOS and either a drain terminal or a source terminal of the first MOS, and the at least two MOS are configured to cross gate nodes and drain nodes that are connected to the gate terminal and either the drain terminal or the source terminal of the first MOS, respectively.

2. The CMOS analog switch of claim 1, wherein the voltage extractors comprise:
   a first voltage extractor configured to extract a drain-side voltage of the first MOS; and
   a second voltage extractor configured to extract a source-side voltage of the first MOS.

3. The CMOS analog switch of claim 2, wherein the first voltage extractor comprises a second MOS and a third MOS with crossing gate nodes and drain nodes that are connected to the gate terminal and the drain terminal of the first MOS, respectively, and with source nodes connected to the substrate node, and the second voltage extractor comprises a fourth MOS and a fifth MOS with crossing gate nodes and drain nodes which are connected to the gate node and the source terminal of the first MOS, respectively, and source nodes connected to the substrate node.

4. The CMOS analog switch of claim 3, wherein the first to fifth MOS are all of the same type.

5. The CMOS analog switch of claim 3, wherein a voltage potential of the substrate node is the same as a voltage potential at the gate of the first MOS or at a source side of the first MOS.

6. The CMOS analog switch of claim 1, further comprising a charge pump configured to increase the supply voltage so that a voltage higher than the supply voltage is applied to the gate terminal of the first MOS.

7. The CMOS analog switch of claim 1, further comprising:
   an inverter connected to a gate node of the first MOS; and
   a sixth MOS connected so as to be on or off in response to an output signal of the inverter, wherein
   in response to the supply voltage being supplied and the first MOS being in an off state, the substrate voltage of the substrate node is biased to the ground voltage via the sixth MOS, which is turned on in response to a high signal of the inverter.

8. The CMOS analog switch of claim 7, wherein in the sixth MOS, a gate is connected to an output end of the inverter, a drain is connected to the substrate node, and a source is grounded.

9. The CMOS analog switch of claim 8, wherein the inverter operates when a drain-side voltage and a source-side voltage of the first MOS both exceed a threshold voltage.

10. The CMOS analog switch of claim 9, further comprising a seventh MOS configured to receive a control signal with an opposite phase to that of the control signal applied to the first MOS, wherein
    in response to the sixth MOS maintaining an off state, the seventh MOS turns on in response to a high control signal to bias the substrate voltage of the substrate node with a ground voltage level to the ground voltage.

11. The CMOS analog switch of claim 10, wherein the sixth and seventh MOS are of the same type of MOS as the first MOS.

12. The CMOS analog switch of claim 6, further comprising a third voltage extractor comprising two MOS in which gate nodes and drain nodes cross each other and are connected to the drain node and the source node of the first MOS, wherein
    the two MOS are of a different type from the first MOS, and abnormal voltage applied to the drain side or source side of the first MOS is extracted.

13. The CMOS analog switch of claim 12, wherein, in response to the supply voltage not being supplied, the third voltage extractor extracts an applied abnormal voltage received at the drain side or source side of the first MOS, and the substrate voltage of the substrate node is biased to ground voltage via the third voltage extractor and the sixth MOS which turns on in accordance with an output signal from the inverter.

14. A Complementary Metal-Oxide-Semiconductor (CMOS) analog switch, comprising:
- a first Metal-Oxide-Semiconductor Field Effect Transistor (MOS) configured to receive a supply voltage and switch in response to an externally-applied control signal;
- a first voltage extractor configured to extract a drain-side voltage of the first MOS, wherein the first voltage extractor comprises a second MOS and a third MOS; and
- a second voltage extractor configured to extract a source-side voltage of the first MOS, the second voltage extractor comprises a fourth and a fifth MOS,
- wherein the first to fifth MOS are all of the same type, and
- the first voltage extractor or the second voltage extractor biases the extracted voltage to a substrate node of the first MOS, and each of the voltage extractors is connected to a gate terminal and either a drain terminal or a source terminal of the first MOS,
- wherein the first voltage extractor comprises a second MOS and a third MOS with crossing gate nodes and drain nodes that are connected to the gate terminal and the drain terminal of the first MOS, respectively.

15. The CMOS analog switch of claim 14, wherein the second MOS and the third MOS of the first voltage extractor comprises source nodes connected to the substrate node.

16. The CMOS analog switch of claim 14, the second voltage extractor comprises a fourth and a fifth MOS with crossing gate nodes and drain nodes which are connected to the gate node and the source terminal of the first MOS, respectively, and source nodes connected to the substrate node.

17. The CMOS analog switch of claim 14, wherein a voltage potential of the substrate node is same as a voltage potential at the gate of the first MOS or at a source side of the first MOS.

18. The CMOS analog switch of claim 14, further comprising a charge pump configured to increase the supply voltage so that a voltage higher than the supply voltage is applied to the gate terminal of the first MOS.

19. The CMOS analog switch of claim 14, further comprising:
- an inverter connected to a gate node of the first MOS; and
- a sixth MOS connected so as to be on or off in response to an output signal of the inverter, wherein
- in response to the supply voltage being supplied and the first MOS being in an off state, the substrate voltage of the substrate node is biased to the ground voltage via the sixth MOS, which is turned on in response to a high signal of the inverter.

20. The CMOS analog switch of claim 19, further comprising a third voltage extractor comprising two MOS in which gate nodes and drain nodes are crossed each other and connected to the drain node and the source node of the first MOS, wherein
- the two MOS are different type from the first MOS, and abnormal voltage applied to the drain side or source side of the first MOS is extracted.

* * * * *